United States Patent
Chen et al.

(10) Patent No.: US 11,161,957 B2
(45) Date of Patent: Nov. 2, 2021

(54) THREE-DIMENSIONAL POROUS STRUCTURE OF PARYLENE

(71) Applicant: MAY-HWA ENTERPRISE CORPORATION, Taipei (TW)

(72) Inventors: Hsien-Yeh Chen, Taipei (TW); Hsing-Ying Tung, Changhua County (TW)

(73) Assignee: MAY-HWA ENTERPRISE CORPORATION, Taipei (TW)

( * ) Notice: Subject to any disclaimer, the term of this patent is extended or adjusted under 35 U.S.C. 154(b) by 451 days.

(21) Appl. No.: 15/475,163

(22) Filed: Mar. 31, 2017

(65) Prior Publication Data
US 2018/0201749 A1    Jul. 19, 2018

(30) Foreign Application Priority Data
Jan. 18, 2017   (TW) .................... 106101650

(51) Int. Cl.
| | | |
|---|---|---|
| B29C 69/00 | (2006.01) | |
| C08J 9/26 | (2006.01) | |
| C23C 16/44 | (2006.01) | |
| C23C 16/01 | (2006.01) | |
| C23C 16/30 | (2006.01) | |
| C08G 61/02 | (2006.01) | |

(52) U.S. Cl.
CPC ............. C08J 9/26 (2013.01); C23C 16/01 (2013.01); C23C 16/30 (2013.01); C23C 16/44 (2013.01);
(Continued)

(58) Field of Classification Search
CPC ............ C08J 2201/042; C08J 2201/048; C08J 2201/0484; C08J 2201/0504; C08J 2365/04; C08J 9/26; C23C 16/44
See application file for complete search history.

(56) References Cited

U.S. PATENT DOCUMENTS 9,976,815 B1 *   5/2018  Roper .................... B23P 15/26
2005/0035983 A1*   2/2005  Cruchon-Dupeyrat ....................
                                                                B82Y 10/00
                                                                346/140.1
(Continued)

FOREIGN PATENT DOCUMENTS

JP          S50-153776          12/1975
JP          2000-183056 A        6/2000
(Continued)

OTHER PUBLICATIONS

Christine P. Tan et al., Surface Engineering and Patterning Using Parylene for Biological Applications, materials 2010, 3, doi: 10.3390/ma3031803, Mar. 15, 2010, pp. 1803-1832, XP055126906.
(Continued)

*Primary Examiner* — Ryan M Ochylski
(74) *Attorney, Agent, or Firm* — Hamre, Schumann, Mueller & Larson, P.C.

(57) ABSTRACT

The present invention provides a 3D porous structure of parylene including a poly-p-xylylenes structure having a plurality of pores. The poly-p-xylylenes structure has a porosity. According to an embodiment of the present invention, the size of the porous structure is between 20 nm and 5 cm. According to an embodiment of the present invention, the porosity is between 55% and 85%. According to an embodiment of the present invention, the porous structure further includes a plurality of target molecules. According to an embodiment of the present invention, the pores of the poly-p-xylylenes structure include pore sizes of different sizes. The pore sizes are varying in a gradient. According to an embodiment of the present invention, the porous structure is formed integrally.

20 Claims, 8 Drawing Sheets

(52) U.S. Cl.
CPC ... *C08G 61/025* (2013.01); *C08G 2261/3424* (2013.01); *C08J 2201/042* (2013.01); *C08J 2365/04* (2013.01)

(56) References Cited

U.S. PATENT DOCUMENTS

| | | | |
|---|---|---|---|
| 2007/0228606 A1* | 10/2007 | Hanefeld | D01D 5/00 264/299 |
| 2008/0269456 A1 | 10/2008 | Lahann | |
| 2013/0215197 A1 | 8/2013 | Hays | |
| 2013/0224277 A1* | 8/2013 | Amedee | A61L 27/12 424/423 |

FOREIGN PATENT DOCUMENTS

| | | |
|---|---|---|
| JP | 2007-322219 A | 12/2007 |
| WO | 03/011952 A1 | 2/2003 |
| WO | 2007/008607 A2 | 1/2007 |

OTHER PUBLICATIONS

James Erjavec et al., Wave Polymerization During Vapor Deposition of Porous Parylene-N Dielectric Films, Mat. Res. Soc. Symp. Proc. vol. 565, 1999 Materials Research Society, XP055430424, 1999, pp. 23-28.

Y.-S. Yeh et al., Polymerization of Para-xylylene Derivatives. VI. Morphology of Parylene N and Parylene C Films Investigated by Gas Transport Characteristics, Journal of Polymer Science: Part B: Polymer Physics, vol. 28, pp. 545-568 (1990), XP055430489, 1990.

Nguyen Binh-Khiem et al., Porous Parylene and Effects of Liquid on Parylene Films Deposited on Liquid, IEEE, MEMS 2011, Cancun, Mexico, Jan. 23-27, 2011, XP031982362, pp. 111-114.

Alexandra Homsy et al., Solid on liquid deposition, a review of technological solutions, ELSEVIER, Microelectronic Engineering, XP029242313, pp. 267-279, 2015.

* cited by examiner

THREE-DIMENSIONAL POROUS STRUCTURE OF PARYLENE

BACKGROUND OF THE INVENTION

1. Field of the Invention

The present invention relates to a method of manufacturing a 3D porous structure. More particularly, the present invention relates to a 3D porous structure of parylene and a method of manufacturing the same.

2. Description of the Prior Art

The process of preparing the parylene film by chemical vapor deposition is a gas phase reaction, which can form a very dense and uniform coating under vacuum. The parylene film has some properties, such as good biocompatibility, biostability and excellent blood compatibility. Poly-p-xylene has been approved by the US Food and Drug Administration, so has been utilized in many applications of relevant in vivo devices. Therefore, the porous materials made by this coating are not dangerous to human body.

The well-known vapor deposition polymer system of poly-para-xylylenes (PPXs) is used in the present invention. The deposition of PPXs occurs on a stationary substrate via adsorption of monomers (para-xylylenes) onto the surface, where the polymerization reaction initiates and the propagation continues by reaction of newly adsorbed monomers; equilibrium is eventually achieved between the rates of adsorption and desorption. The deposition of PPXs occurs, in most cases, irrespective of the substrate material and its shape, a cooled substrate facilitates deposition, and the deposition on a stationary surface creates a dense film of PPX. These characteristics are also found similar for other vapor deposition systems.

Porous materials with controlled mechanical and chemical properties are being developed for applications in separation systems, sensor systems, energy transfer and storage, heterogeneous catalysts, superhydrophobic surfaces, photonic devices, drug delivery, and biomedical scaffolds. These porous materials are currently constructed based on interventional processes, such as by templating, photolithography, soft lithography, gas foaming, and gas or flow mimicking geological processes, which are applied on a stationary material or a precursor. Alternative approaches include additive manufacturing, e.g., 3D printing, laser sintering, projection stereolithography, electrified jetting, the weaving technique, or direct writing, are used to build up porous materials in a layer-by-layer or stacking manner.

Current fabrication methods are limited by the large number of processing steps required the additional effort involved in removing the template, and the requirement of sophisticated computer programming and/or manual intervention to master the construction. Therefore, utilizing the simple principles to lower human costs by simple steps to form porous materials is challenging.

SUMMARY OF THE INVENTION

The present invention provides a new method of manufacturing a 3D porous structure. The key features of the present invention are that construction is based on the vanishing nature of a sublimating template that does not require an additional removal procedure and that a fine replica architecture is obtained in a single step by the conformality of the vapor deposition process and the direct guidance of the sublimating substrate. In addition, the pores are formed during the construction process and the porosity and sizes can be controlled by the sublimation behavior of the template (e.g., by varying the sublimation conditions according to the material's phase diagram or by selecting a different sublimation material).

The present invention in one aspect provides a porous structure of parylene including a poly-p-xylylenes structure having a plurality of pores. The poly-p-xylylenes structure has a porosity. According to an embodiment of the present invention, the size of the porous structure is between 20 nm and 5 cm. According to an embodiment of the present invention, the porosity is between 55% and 85%. According to an embodiment of the present invention, the porous structure further includes a plurality of target molecules. According to an embodiment of the present invention, the pores of the poly-p-xylylenes structure include pore sizes of different sizes. The pore sizes are varying in a gradient. According to an embodiment of the present invention, the porous structure is formed integrally.

The present invention in another aspect provides a method of manufacturing a 3D porous structure. The method includes the steps of: providing a sacrificial solid template; performing a vapor deposition process such that a polymer monomer is deposited on the sacrificial solid template while the sacrificial solid template is conducted to a sublimation process; and consuming the sacrificial solid template to forma 3D porous structure. The sublimation process includes sublimating the sacrificial solid template from a solid phase into a gaseous phase, wherein the polymer monomer is adsorbed on a surface of the gaseous phase of the sacrificial solid template. The 3D porous structure has a porosity, depending on the sublimation rate of the sacrificial solid template, wherein the higher the sublimation rate, the greater the porosity.

According to an embodiment of the present invention, the sacrificial solid template includes a solution. According to an embodiment of the present invention, the concentration of the solution is distributed in the sacrificial solid template in a gradient. According to an embodiment of the present invention, the sacrificial solid template includes a plurality of target molecules, the target molecules is released during the sublimation process of the sacrificial solid template so as to be coated in the 3D porous structure.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

To provide a better understanding of the presented invention, preferred embodiments will be made in detail. The preferred embodiments of the present invention are illustrated in the accompanying drawings with numbered elements.

Figure 1:
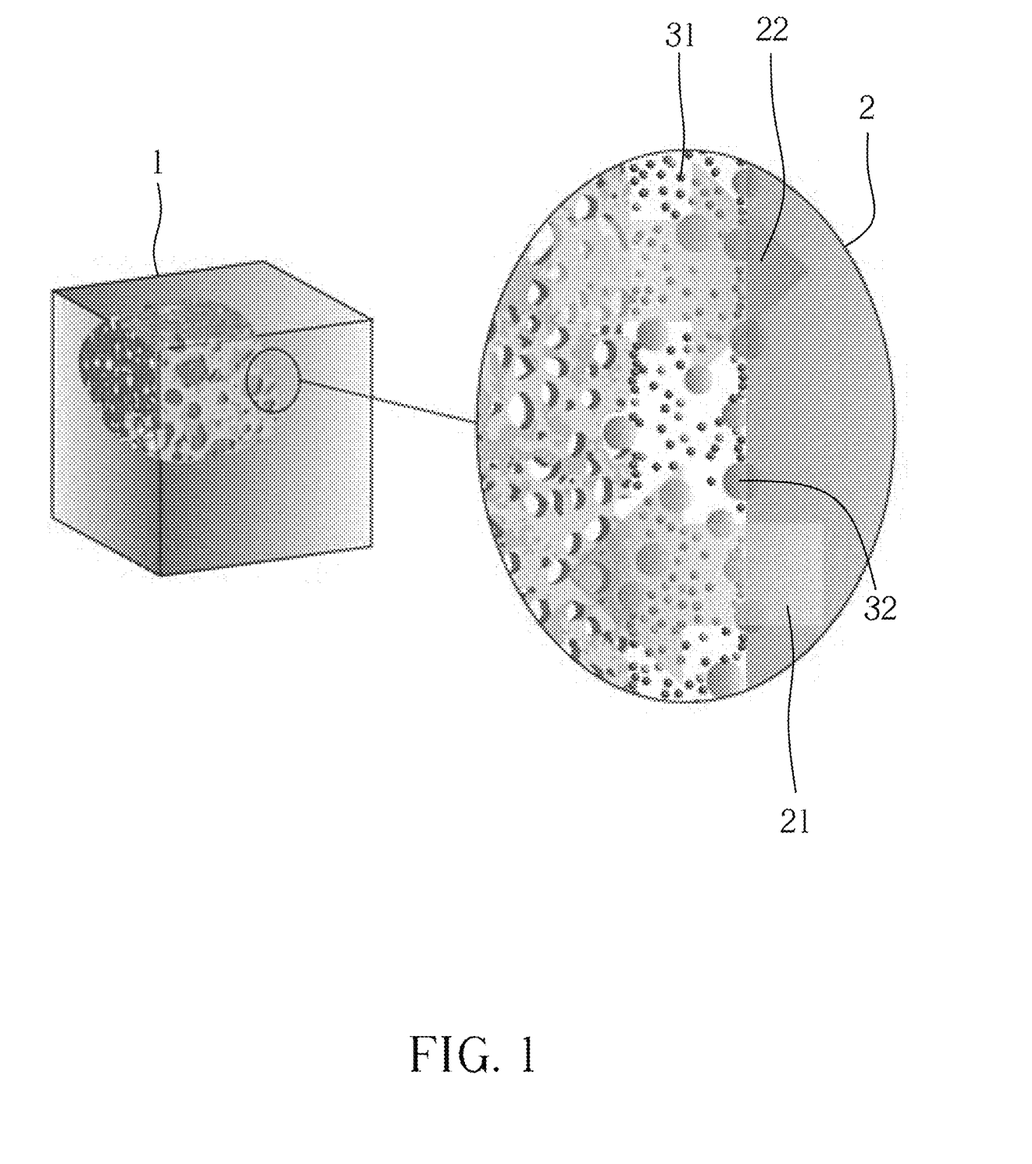
FIG. 1 illustrates a method of manufacturing a 3D porous structure according to the present invention.

FIG. 1 illustrates a method of manufacturing a 3D porous structure according to the present invention. The method utilizes the two processes of sublimation 21 and vapor deposition 22, which simultaneously occur and dynamically compete, thereby forming a porous structure 1 in three dimensions. As shown in FIG. 1, the porous structure 1 is formed at the dynamic vapor-solid interface 2, wherein a deposition molecule 31 and a sacrificial sublimation solid template 32 exploit the same volumetric space; i.e., the vacated space from a sublimating solid template 32 is seamlessly filled by the deposition molecule 31 via vapor deposition.

In contrast to the adsorption-limited mechanism of conventional PPX deposition onto a stationary substrate, in a method of the present invention, the sublimating ice rendered a dynamic substrate and the deposition of PPXs onto sublimating ice proceeded via a diffusion-limited mechanism in which the monomers diffused continuously to a newly formed surface of sublimating ice substrate. The adsorption on such surfaces was only temporary, allowing the polymerization reaction occurs in three dimensions. Macroscopically, the construction upon deposition is directed by the sublimation of a sacrificial template, whose surface/interface provides a temporary support before complete consumption of the template by sublimation. In addition, such a dependence also parallels a conformal mechanism of vapor deposition, which requires the adsorption of vapor precursors on the sublimating surface. These directive dependencies allow the resulting deposition to formulate a final architecture that replicates the sacrificial template.

The 3D porous structures of the present invention are constructed via vapor deposition onto a sublimating solid template. Construction upon deposition of vapor-phase material occurs at a dynamic vapor-solid interface and is directed by the solid surface vanishing by sublimation. Characteristics of the pore structures are formed during the construction process as a result of the gas vapor and the space that is vacated by sublimation, thus enabling control of the porosity through regulation of the sublimation speed and/or the thermodynamic properties of the templates.

Figure 2:
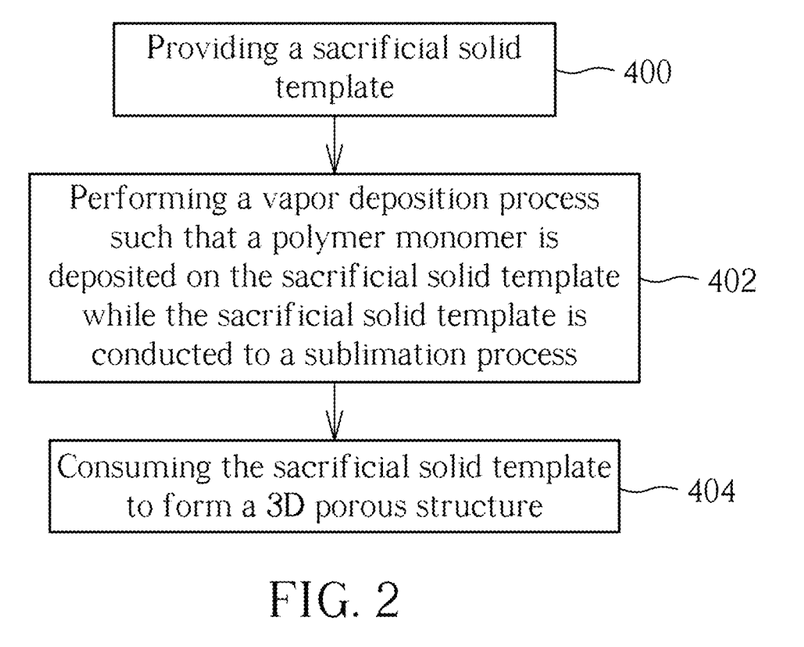
FIG. 2 illustrates steps of manufacturing a 3D porous structure according to the present invention.

FIG. 2 illustrates steps of manufacturing a 3D porous structure according to the present invention. As shown in FIG. 2, the method of the present invention includes the following steps:

Step 400: providing a sacrificial solid template;

Step 402: performing a vapor deposition process such that a polymer monomer is deposited on the sacrificial solid template while the sacrificial solid template is conducted to a sublimation process; and Step 404: consuming the sacrificial solid template to form a 3D porous structure.

The following describes each step.

First, a sacrifice solid template is provided (step 400). The sacrificial solid template may be any substance or mixture in the form of a solid and may perform a sublimation reaction under a condition. In one embodiment, the sacrificial solid template is a water molecule. When the solid form (ice) of the water molecule is at 0.1 mbar, it can be sublimated from solid form (ice) to the water vapor at about more than −50° C. However, at the same pressure and temperature, the gas phase monomer of PPX tends to polymerize and deposit. In one embodiment, the sacrificial solid template may also be formed by freezing the mixed solution having a different sublimation property. In one embodiment, the mixed solution may include two substances that are miscible, for example, water molecules and ethanol, but are not limited thereto. Alternatively, in another embodiment, the mixed solution may include two substances that are not miscible, for example, water molecules and hexane, but are not limited thereto. In one embodiment, the sacrificial solid template may contain a variety of target molecules in advance. In one embodiment of the present invention, the target molecule may include a fluorescent molecule, a biological factor and/or a nanoparticle. According to an embodiment of the present invention, the fluorescent molecule may be a fluorescein-labeled peptide (FITC-KKKRGD) or Alexa Fluor® 555 azide, but is not limited thereto. According to an embodiment of the present invention, the biological factor may be an organism including an homogeneousness organism or a heterologous organism, for example, a fibroblast growth factor (FGF2) which is a newborn blood vessel. According to an embodiment of the present invention, the size of the nanoparticles is between 20 nm and 5 cm. In one embodiment, the nanoparticles may be, for example, iron oxide ($Fe_3O_4$), gold (Au) and/or silver (Ag), but are not limited thereto.

Next, a vapor deposition process is performed such that a polymer monomer is deposited on the sacrificial solid template while the sacrificial solid template is conducted to a sublimation process (step 402). Any polymer monomer that can perform the vapor deposition process provides a polymer having a low sticking coefficient, for example $10^{-3}$ to $10^{-5}$, to ensure the conformality of the architecture and the uniformity of the pore structures. In the preferred embodiment of the present invention, the PPX structure is formed by the vapor deposition process with a pyrolysis process shown in below reaction 1, from as paracyclophane as a monomer.

(Reaction 1)

The paracyclophane in the present invention can have various functional groups so as to form the functionalized PPX structure. In one embodiment, the PPX structure includes the following structure with formula (1):

formula (1)

wherein $R_1$ and $R_2$ is selected from a group consisting of hydrogen, —C(=O) H, —C(=O)—$CFH_2$, —C(=O)—$CF_3$, —C(=O)—$C_2F_5$, —C(=O)—$C_8F_{17}$, —C(=O)—OH, —C(=O)-Ph, —C≡CH, —CH=$CH_2$, —$CH_2$—OH, —$CH_2$—$NH_2$, —$NH_2$, —C(=O)—O—$CH_3$, —C(=O)—O—$C_2H_5$, —$CH_2$—O—C(=O)—C—$(CH_3)_2$Br, —$CH_2$—O—C(=O)—C≡CH, a chemical structure of formula (1-1), a chemical structure of formula (1-2) and a chemical structure of formula (1-3), and $R_1$ and $R_2$ are not simultaneous hydrogen, and m and n refer to an integral greater than 750,000:

wherein in formula (1-1), $R_3$ refer to —$CH_2$—, —$CH_2$—$CH_2$—O—C(=O)—, —$CH_2$—$CH_2$—NH—C(=O)—, —C(=O)— or —O—$CH_2$—; and $R_4$ and $R_5$ refer to hydrogen, methyl or chloride.

In another embodiment, the PPX structure includes the following structure:

formula (2-3)

wherein m and n refer to an integral greater than 750,000.

In one preferred embodiment, the PPX structure is PPX-C (Parylene C).

The vapor deposition process depends on the polymer monomer used so as to select the most suitable deposition parameter. The preferred deposition temperature is the temperature required for the sublimation of the sacrificial solid template. In one embodiment of the present invention, the pressure of the chemical vapor deposition system is maintained at 0.1 mbar (mbar) with, for example, parylene. The compounds having a paracyclophane are pyrolyzed in the temperature range of 670° C. to 700° C. to obtain a polymer monomer. The sacrificial solid template is then placed on a stage and the polymer monomer is deposited on the sacrificial solid template with a stage temperature range of −20° C. to 60° C.

Finally, after a sacrificial solid template is consumed, a 3D porous structure is formed (step 404). The porous structure of parylene of the present invention has a plurality of pores and a porosity. The porosity in the present invention refers to the volume of pores in the porous structure, that is, the ratio of the volume of all pores to the volume exhibited by the outermost contour of the porous structure. In one embodiment, the porosity can be measured by a Mercury porosimeter, which is calculated using the relationship between the high surface tension of mercury and the pressure required to press into the pores, with the parameter below: at the pressure in the range of 0.1 to 50 psia and a measurement range of 360 to 3.6 um; and at atmospheric pressure to 60000 psia and measurement range of 6~0.003 um.

Since the volume of the sublimed gas is proportional to the disappearance volume of the solid template, the porosity is associated with the sublimation rate, i.e., the higher sublimation rate causes a greater porosity. Therefore, the present invention can obtain the porous structures having different porosities by adjusting any parameters that can affect the sublimation rate. In one embodiment of the present invention, the porosity is controlled by adjusting the temperature. For example, the water molecule is used as the sacrificial solid template, and the sublimation rate is varied by reducing or elevating the temperature to −15° C. or 25° C. while maintaining the system pressure at 0.1 mbar. In one embodiment of the present invention, the porosity is controlled by using a mixture solid template formed by mixing two or more kinds of substances having different sublimation heat. The rate of mass (or volume) transfer for sublimating the solid template is proportional to the temperature variation, following the mass transport equation I:

$$h(T_o - T_s) = \Delta H\left(\frac{dm}{dt}\right) = \Delta H\left(\frac{\rho dV}{dt}\right) \quad \text{(equation I)}$$

where h is the heat transfer coefficient of the system, $T_o$ is the operating temperature, $T_s$ is the temperature of sublimating the template, h is the heat transfer coefficient, $\Delta H$ is the latent heat of sublimation, m is the mass of template, $\rho$ is the density of template, and V is the volume of template.

The heat transfer coefficient h and the latent heat of sublimation $\Delta H$ are consider constant during the fabrication process when using the same solid template, and the differential term $$\left(\frac{dm}{dt}\right)$$

describes the rate of solid template mass (m) that is being sublimated and is equal to the product of density ($\rho$) and volume (V).

Hereinafter, the embodiments of the present invention are described in detail.

Example 1

Figure 3:
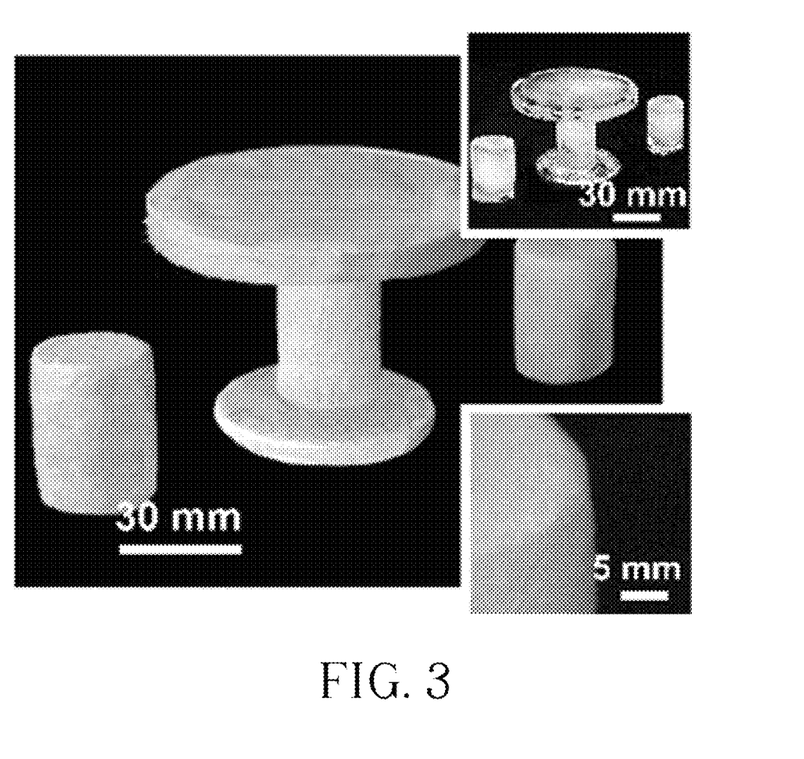
FIG. 3 is an image of a 3D porous structure according to the first embodiment of the present invention, wherein the upper side of the image is a solid template image and the lower side of the image is an enlarged view of the porous structure.

The present embodiment is made of a special shape of ice as a solid sacrificial template, and the shape of the poly-p-xylylenes is replica architecture with the template because of the sticking coefficient of the parylene (about $10^{-4}$), to ensure the conformality of the architecture and the uniformity of the pore structures. FIG. 3 is an image of a 3D porous structure according to the first embodiment of the present invention, wherein the upper side of the image is a solid template image and the lower side of the image is an enlarged view of the porous structure. According to the present embodiment, using an ice model of a table (dimensions: 80 mm-diameter and 50 mm-height) or a chair (dimensions: 30 mm-diameter and 35 mm-height) as the sacrificial solid template (the upper side image of FIG. 3) will form a porous structure of the table or the chair (the lower side image of FIG. 3). In an embodiment of the present invention, a cubic porous structure can be formed by using the cube ice model of 400 µm×400 µm×400 µm as the sacrificial solid template. In an embodiment of the present invention, a spherical porous structure can be formed by using a spherical ice model having a diameter of 1,800 µm. The above results demonstrate that the appearance of the porous structure of the present invention can be designed according to the sacrificial solid template.

Example 2

Figure 4A:
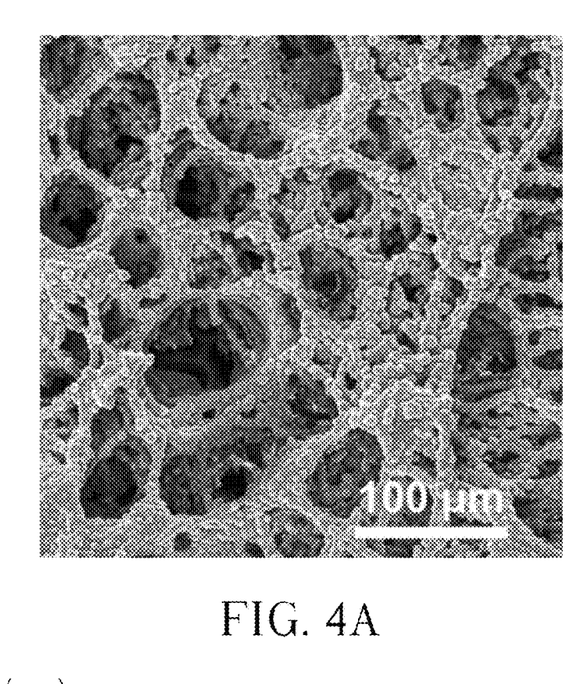
FIG. 4A is a scanning electron microscope (SEM) image of a 3D porous structure according to the second embodiment of the present invention.
Figure 4B:
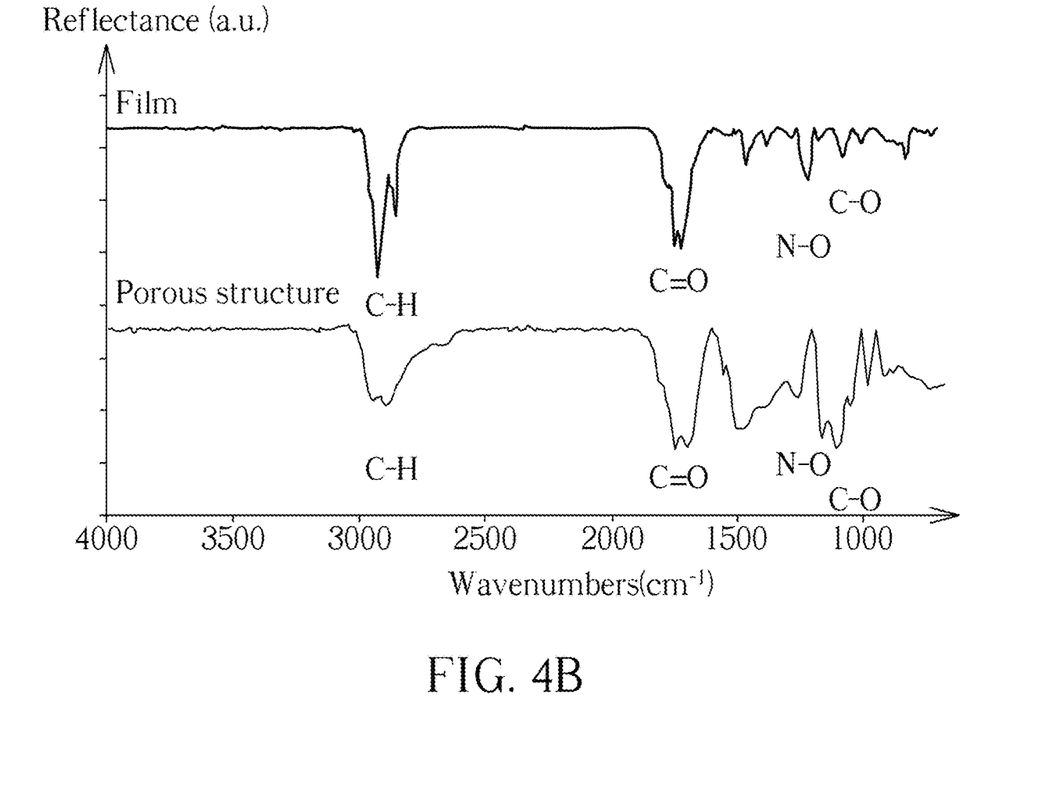
FIG. 4B is a Fourier transform infrared spectrometer (FT-IR) spectrum of a 3D porous structure according to the second embodiment of the present invention.

The present invention may deposit other derivatives of parylene(PPX) on a sublimated sacrificial solid template. The derivative refers to parylene having various functional groups. The porous structure of the present embodiment is formed by using a PPX having a special functional group. FIG. 4A is a scanning electron microscope (SEM) image of a 3D porous structure according to the second embodiment of the present invention. According to the second embodiment of the present invention, a parylene monomer with succinimidyl ester functionality is deposited on an ice solid template to form a functional parylene structure. As shown in FIG. 4A, the parylene structure having a succinimidyl ester functionality formed according to the present invention has a porous structure. FIG. 4B is a Fourier transform infrared spectrometer (FT-IR) spectrum of a 3D porous structure according to the second embodiment of the present invention, in which the abscissa is a wavenumbers (cm$^{-1}$)

and the vertical axis is a reflectance (a. u.). As shown in FIG. 4B, the chemical composition of the porous structure of the parylene derivative of the present invention is measured, and the peak positions and intensities observed from the spectrum are consistent with those in the spectra of PPX derivative films prepared by conventional chemical vapor deposition methods. It was confirmed that the present invention successfully used the derivative of parylene to form a porous structure.

Example 3

Figure 5A:
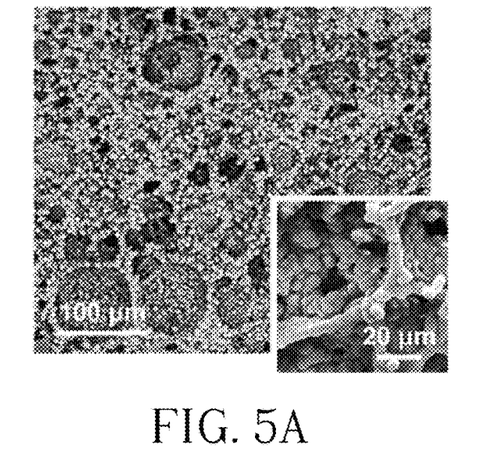
FIG. 5A to FIG. 5C are SEM images of a 3D porous structure according to the third embodiment of the present invention.
Figure 5B:
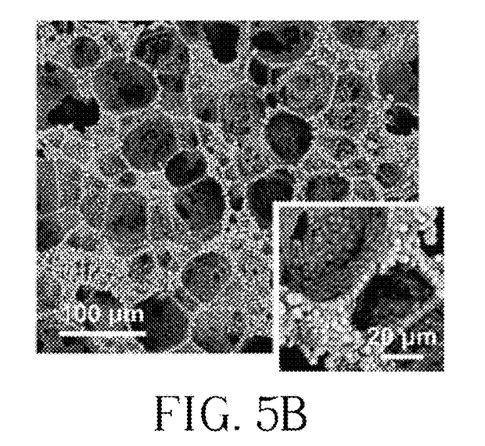
Figure 5C:
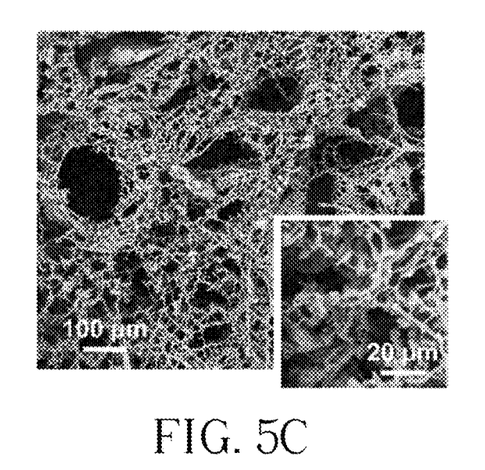

Since the volume of the sublimed gas is proportional to the disappearance volume of the solid template, the higher sublimation rate cause greater porosity, while lower sublimation rates are reversed. According to the third embodiment of the present invention, the water molecule is used as the sacrificial solid template, and the sublimation rate is varied by reducing or elevating the temperature to −15° C. or 25° C. while maintaining the system pressure at 0.1 mbar. Based on the equation I above, a sublimation volume increases by 6.3% when increasing the operating temperature from 4° C. to 25° C.; and a 5.6% of decreased volume from 4° C. to −15° C. FIG. 5A to FIG. 5C are SEM images of a 3D porous structure according to the third embodiment of the present invention. As shown in FIG. 5A, a porous structure having a pore diameter of 21 μm and a porosity of 61% is formed by operating temperature of −15° C. As shown in FIG. 5B, a porous structure having a pore diameter of 40 μm and a porosity of 69.1% is formed by operating temperature of 4° C. As shown in FIG. 5C, a porous structure having a pore diameter of 89 μm and a porosity of 74.3% is formed by operating temperature of 25° C. According to the results of FIGS. 5A to 5C, it is shown that a smaller pore size is obtained at a lower sublimation rate (low temperature) and a larger pore size is obtained at a higher sublimation rate (high temperature). Furthermore, it can also be observed from the figures that a dense porous structure is formed at a lower sublimation rate and a branched porous structure is formed at a higher sublimation rate.

Example 4

The sacrificial solid template of the present invention can be prepared by mixing two or more kinds of substances, and the sublimation rate of the sacrificial solid template is adjusted based on the different sublimation properties of the substances. In the first case of the present embodiment, the two miscible substances are selected, and in the second case of the present embodiment, the two immiscible substances are selected, to thereby compare the porosity of the two cases.

In the first miscible embodiment, the two miscible substances may be water molecules and ethanol. According to an embodiment of the present invention, the water molecules (80%) and ethanol (20%) are mixed and the mixture solution is frozen in a cooling bath of liquid nitrogen to form a mixture solid template.

In the second immiscible embodiment, the two immiscible substances may be water molecules and hexane. According to an embodiment of the present invention, the water molecules (90%) and hexane (10%) are mixed and the mixture solution is frozen in a cooling bath of liquid nitrogen to form a mixture solid template.

Figure 6A:
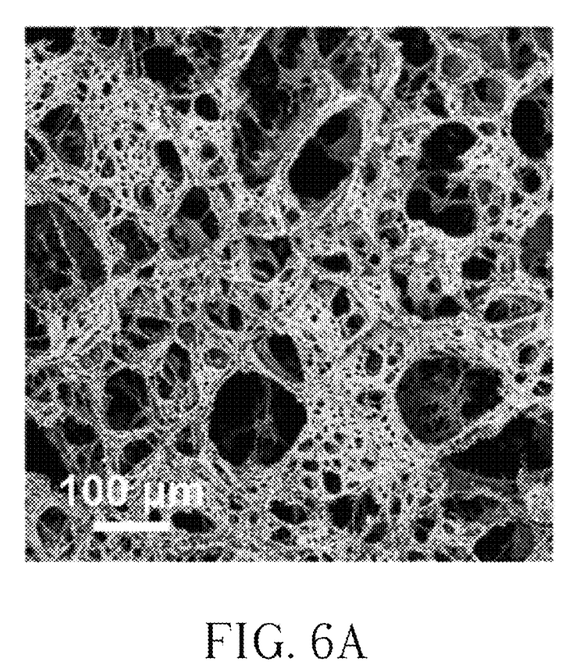
FIG. 6A to FIG. 6B are SEM images of a 3D porous structure according to the forth embodiment of the present invention.
Figure 6B:
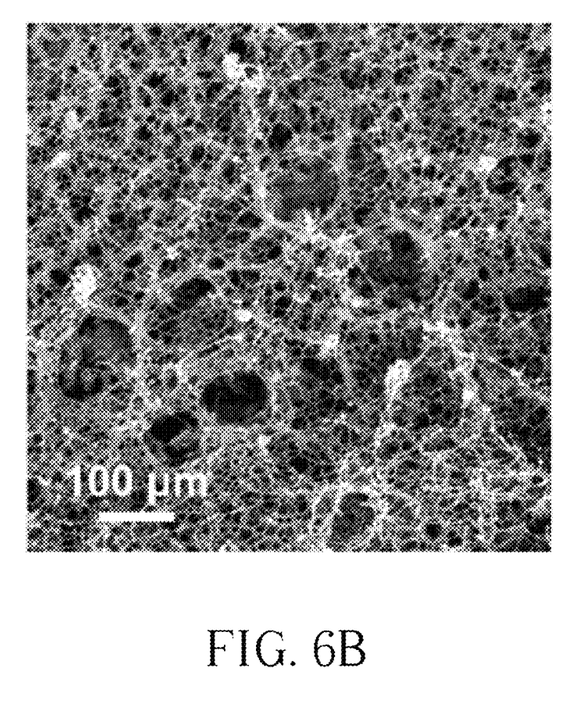

FIG. 6A to FIG. 6B are SEM images of a 3D porous structure according to the forth embodiment of the present invention.

In the first miscible embodiment, as shown in FIG. 6A, the porous structure of parylene formed by using a mixture template composed of water molecules and ethanol at an operating temperature of 4° C., and the pore size is 64 μm and the porosity is 82.5%. Ethanol has a lower sublimation heat (higher sublimation rate) than the water molecules. Therefore, comparing with the porous structure formed by simply using water molecules as a sacrificial solid template at an operating temperature of 4° C., a mixture template adding ethanol has a larger pore size and porosity. In addition, since the water molecules are miscible with ethanol, the resulting porous structure has a similar pore size.

In the second immiscible embodiment, as shown in FIG. 6B, the porous structure of parylene formed by using a mixture template composed of water molecules and hexane at an operating temperature of 4° C., and the pore size is 36 μm and the porosity is 57.5%. Hexane has a higher sublimation heat (lower sublimation rate) than the water molecules. Therefore, comparing with the porous structure formed by simply using water molecules as a sacrificial solid template at an operating temperature of 4° C., a mixture template adding hexane has a smaller pore size and porosity. In addition, since the water molecules are immiscible with hexane, the pore sizes correspond to independent systems from different sublimation rates, so the resulting porous structure has a graded pore size.

Example 5

The sacrificial solid template of the present invention may utilize a mixture template containing a gradient composition. This template provides a gradient of vapor pressure corresponding different sublimation rate, thereby forming a gradient porous structure has a plurality of pore sizes. The gradient composition in the present invention refer to the concentration of a substance in the mixture template varies in a particular direction.

According to an embodiment of the present invention, the preparation of the gradient template is carried out by first flowing the ethanol into the water molecular system in a polypropylene centrifuge tube (10 mm inner diameter), wherein the concentration of ethanol increases with increasing height to generate a mixture system having a gradient composition, and a cooling bath of liquid nitrogen is used to freeze the flow mixture system approximately 5 seconds after the flow started and before it reached a fully developed state of a homogenous mixture system.

Figure 7A:
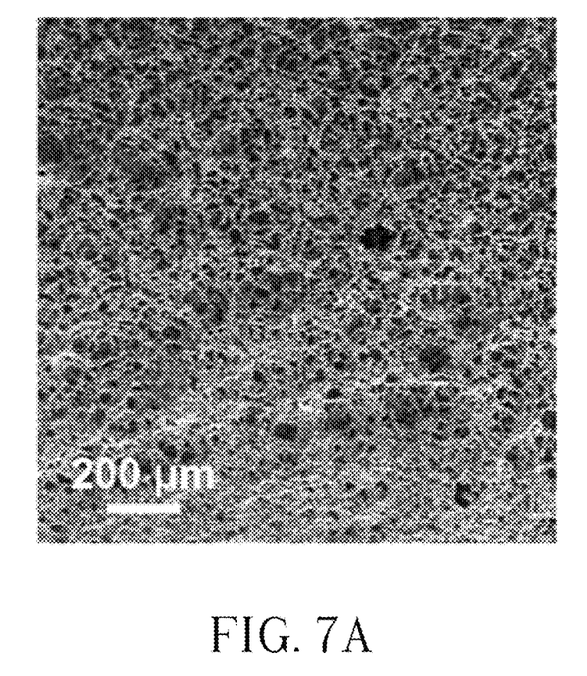
FIG. 7A and FIG. 7B are SEM image and three-dimensional computed tomography (micro-CT) image of a 3D porous structure produced by using the gradient sacrificial solid template.
Figure 7B:
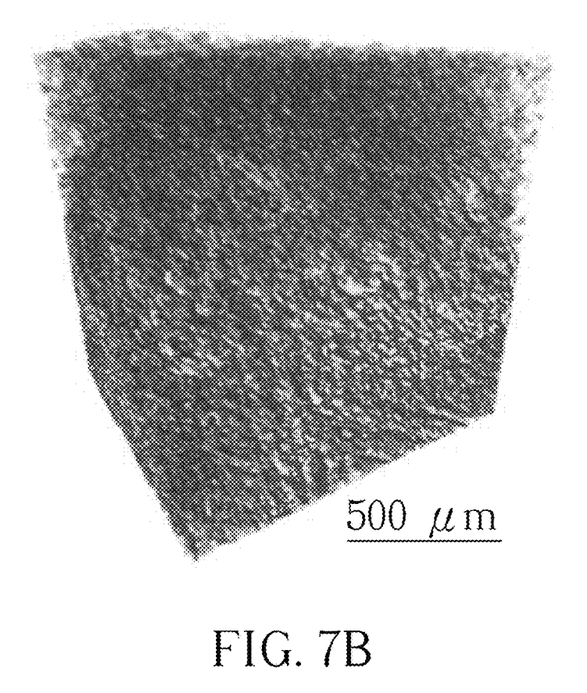

FIG. 7A and FIG. 7B are SEM image and three-dimensional computed tomography (micro-CT) image of a 3D porous structure produced by using the gradient sacrificial solid template.

The gradient porous structure formed by the present invention includes a plurality of pore sizes which vary in a gradient. As shown in FIG. 7A, the gradient porous structure formed by using the gradient mixture template, wherein the pore size increases with increasing the concentration of ethanol (above the image). The pore size changes in a gradient due to the higher vapor pressure of ethanol (faster sublimation rate), and hence the formation of larger pore size.

It is worth noted that the gradient porous structure of the present invention is formed integrally. As shown in FIG. 7B, the gradient porous structure is integrally formed by using the gradient mixture template and does not have a layered structure.

It should be understood that it is not necessary to use a gradient mixture template to create a gradient pore structure as long as the sublimation rate can be varied, for example, by applying a gradient operating temperature.

Example 6

The sacrificial solid template of the present invention may contain various target molecules in advance and the resulting porous structure also contains the target molecule. In the present example, the solution containing the target molecule was frozen by using a liquid nitrogen cooling bath to prepare a sacrificial solid template containing the target molecule. In the present example, the target molecule is a fluorescein-labeled peptide (FITC-KKKRGD) or Alexa Fluor® 555 azide. In other embodiments, the target molecules may be a biological factor and/or a nanoparticle.

Figure 8:
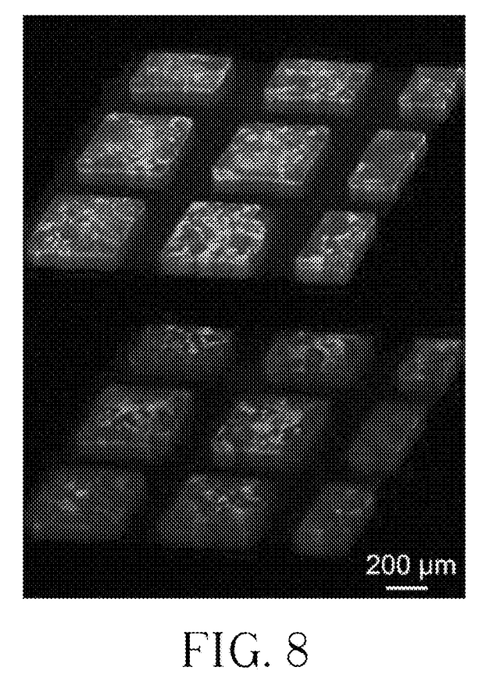
FIG. 8 is a 3D conjugate-focus laser scanning microscopic image of a 3D porous structure according to the sixth embodiment of the present invention.

FIG. 8 is a 3D conjugate-focus laser scanning microscopic image of a 3D porous structure according to the sixth embodiment of the present invention.

In the embodiment containing the fluorescent molecule, as shown in FIG. 8, the upper row is the porous structure formed by using a sacrificial solid template containing a fluorescent label-containing FITC-KKKRGD as a target molecule, and the down row is the porous structure formed by using a sacrificial solid template containing a fluorescent label-containing Alexa Fluor® 555 azide as the target molecule. The results show that if a sacrificial solid template containing the target molecules is used, it will form a porous structure containing the target molecules.

During the sublimation and deposition process, the target molecules that separated from the sublimating solid template were followed by an "uptake process" by the deposited PPXs; this process was based on entrapment or adsorption affinity within the pores and/or on the PPXs' surfaces. Because of the continued sublimation and deposition process, or the separation and uptake process during the formation of the porous structure, the target molecules exhibit an isotropic and homogeneous distribution throughout the entire porous structure.

The use of a target molecules-containing sacrificial solid template provides a unique approach for the loading/localization of functional molecules into the porous materials and has overcome the challenge of diffusion inefficiency and inhomogeneity of the loaded materials.

Example 7

The porous structure of the present invention may be a nanoscale particles and may be combined with Example 6 of the present invention. According to an embodiment of the present invention, water molecules are sprayed on a superhydrophobic surface by using a nano-mist sprayer to form nanoscale water droplets, and then the nanoscale water droplets are frozen by using a liquid nitrogen cooling bath to form a nanoscale sacrificial solid template.

Figure 9A:
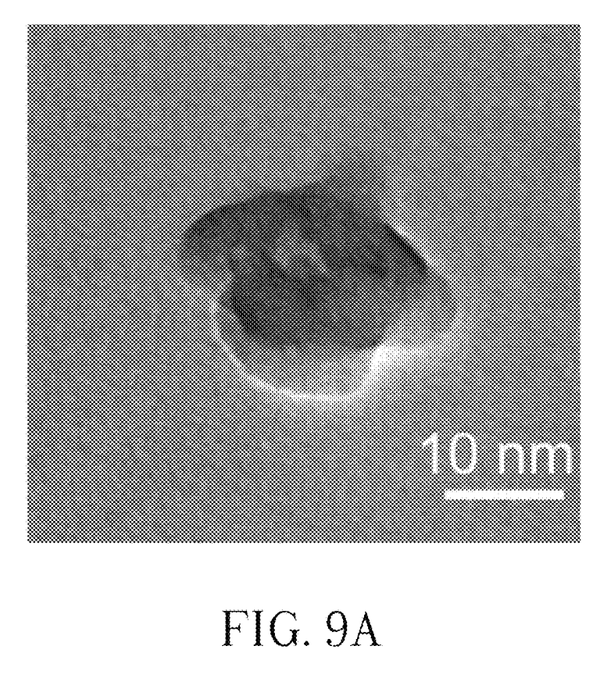
FIG. 9A is a transmission electron microscope (TEM) image of a 3D porous structure according to the seventh embodiment of the present invention.

FIG. 9A is a transmission electron microscope (TEM) image of a 3D porous structure according to the seventh embodiment of the present invention. As shown in FIG. 9A, a nanoscale porous structure is formed by using a nanoscale sacrificial solid template, wherein a size of the porous structure is between 20 nm and 5 cm.

In addition, the present embodiment may be combined with Example 6 of the present invention. In the present embodiment, the nanoscale sacrificial solid template may contain nanoparticles such as iron oxide ($Fe_3O_4$), gold (Au), and/or silver (Ag).

Figure 9B:
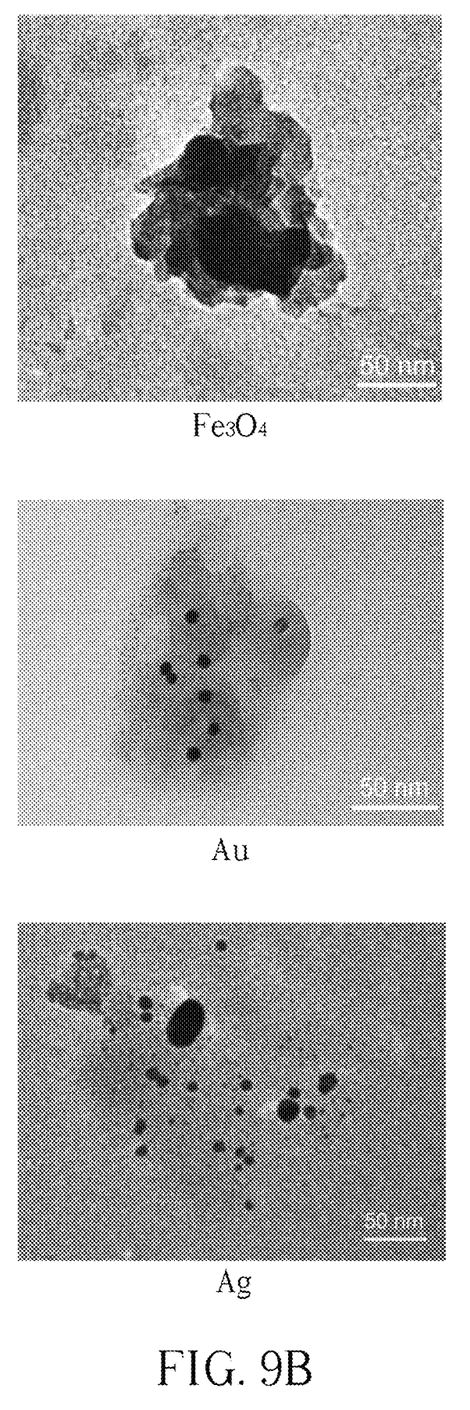
FIG. 9B is a TEM image of a 3D porous structure according to the seventh embodiment of the present invention.

FIG. 9B is a TEM image of a 3D porous structure according to the seventh embodiment of the present invention. According to an embodiment of the present invention, the nanoscale porous structures contain the target molecules are formed by using a nanoscale sacrificial solid template respectively containing iron oxide (10-15 nm), gold (12 nm), and silver (20 nm) as a target molecule, as shown in FIG. 9B, in which the dark-colored areas are the target molecule and the light-colored areas are 3D porous structure of parylene.

The present invention provides a novel method of manufacturing a 3D porous structure with overturning the conventional notion that vapor deposition must necessarily forma dense film on the substrate, and the 3D porous structure of the present invention still retains the chemical and structural advantages of the film. The present invention utilizes poly-p-xylene to produce a porous structure of three-dimensional, diverse and different pore sizes with a porosity range from 55% to 85%. With also the knowledge of materials' sublimation thermodynamics, the technology for the vapor deposition of organic polymer, inorganics, and/or combined materials have been well documented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a 3D porous structure, comprising:
providing a sacrificial solid template; and
subjecting a polymer monomer to a vapor deposition process while the sacrificial solid template simultaneously proceeds to a sublimation process such that at a dynamic vapor-solid interface, spaces vacated from the sacrificial solid template are filled by the polymer monomer to form the 3D porous structure,
wherein the polymer monomer is a parylene monomer.

2. The method of manufacturing a 3D porous structure according to claim 1, wherein a shape of the 3D porous structure when the sacrificial solid template is completely consumed is same as that of the sacrificial solid template before being consumed.

3. The method of manufacturing a 3D porous structure according to claim 1, wherein the parylene monomer has a functional group.

4. The method of manufacturing a 3D porous structure according to claim 1, wherein the sublimation process comprises sublimating the sacrificial solid template from a solid phase into a gaseous phase, wherein the polymer monomer is adsorbed on a surface of the gaseous phase of the sacrificial solid template.

5. The method of manufacturing a 3D porous structure according to claim 1, wherein the sacrificial solid template is water molecule.

6. The method of manufacturing a 3D porous structure according to claim 1, wherein the sacrificial solid template comprises a first solution and a second solution, a sublimation heat of the first solution being different from the sublimation heat of the second solution.

7. The method of manufacturing a 3D porous structure according to claim 6, wherein a concentration of the first solution or the second solution is distributed in the sacrificial solid template in a gradient.

8. The method of manufacturing a 3D porous structure according to claim 7, wherein the 3D porous structure is formed integrally.

9. The method of manufacturing a 3D porous structure according to claim 7, wherein the 3D porous structure has a plurality of pores, and the pores comprise pore sizes of different sizes, wherein the pore sizes of the pores vary in a gradient.

10. The method of manufacturing a 3D porous structure according to claim 1, wherein the sacrificial solid template includes a plurality of target molecules, and the target molecules are released during the sublimation process of the sacrificial solid template so as to be coated in the 3D porous structure.

11. A method of manufacturing a 3D porous structure, comprising:

providing a sacrificial solid template; and subjecting a polymer monomer to a vapor deposition process while the sacrificial solid template simultaneously proceeds to a sublimation process such that at a dynamic vapor-solid interface, spaces vacated from the sacrificial solid template are filled by the polymer monomer to form the 3D porous structure, wherein the sacrificial solid template comprises a first solution and a second solution, a sublimation heat of the first solution being different from the sublimation heat of the second solution.

12. The method of manufacturing a 3D porous structure according to claim 11, wherein a shape of the 3D porous structure when the sacrificial solid template is completely consumed is same as that of the sacrificial solid template before being consumed.

13. The method of manufacturing a 3D porous structure according to claim 11, wherein the polymer monomer is parylene monomer.

14. The method of manufacturing a 3D porous structure according to claim 13, wherein the parylene monomer has a functional group.

15. The method of manufacturing a 3D porous structure according to claim 11, wherein the sublimation process comprises sublimating the sacrificial solid template from a solid phase into a gaseous phase, wherein the polymer monomer is adsorbed on a surface of the gaseous phase of the sacrificial solid template.

16. The method of manufacturing a 3D porous structure according to claim 11, wherein the sacrificial solid template is water molecule.

17. The method of manufacturing a 3D porous structure according to claim 11, wherein a concentration of the first solution or the second solution is distributed in the sacrificial solid template in a gradient.

18. The method of manufacturing a 3D porous structure according to claim 17, wherein the 3D porous structure is formed integrally.

19. The method of manufacturing a 3D porous structure according to claim 17, wherein the 3D porous structure has a plurality of pores, and the pores comprise pore sizes of different sizes, wherein the pore sizes of the pores vary in a gradient.

20. The method of manufacturing a 3D porous structure according to claim 11, wherein the sacrificial solid template includes a plurality of target molecules, and the target molecules are released during the sublimation process of the sacrificial solid template so as to be coated in the 3D porous structure.

* * * * *